(12) United States Patent
Shin et al.

(10) Patent No.: US 10,867,752 B2
(45) Date of Patent: Dec. 15, 2020

(54) CAPACITOR AND METHOD OF MANUFACTURING THE SAME

(71) Applicant: SAMSUNG ELECTRO-MECHANICS CO., LTD., Suwon-Si (KR)

(72) Inventors: Hyun Ho Shin, Suwon-Si (KR); Jeong Hoon Ryou, Suwon-Si (KR); Dong Sik Yoo, Suwon-Si (KR); No Il Park, Suwon-Si (KR); Chang Soo Jang, Suwon-Si (KR); Young Kyu Park, Suwon-Si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 85 days.

(21) Appl. No.: 16/004,903

(22) Filed: Jun. 11, 2018

(65) Prior Publication Data

US 2019/0096587 A1   Mar. 28, 2019

(30) Foreign Application Priority Data

Sep. 28, 2017  (KR) ................. 10-2017-0126108
Oct. 25, 2017  (KR) ................. 10-2017-0139478

(51) Int. Cl.
*H01G 4/33*       (2006.01)
*H01G 4/232*      (2006.01)
(Continued)

(52) U.S. Cl.
CPC .............. *H01G 4/33* (2013.01); *H01G 4/012* (2013.01); *H01G 4/085* (2013.01);
(Continued)

(58) Field of Classification Search
CPC .......... H01G 4/30; H01G 4/005; H01G 4/018; H01L 28/60
(Continued)

(56) References Cited

U.S. PATENT DOCUMENTS 7,659,164 B1   2/2010  Yoo
8,385,046 B2   2/2013  Palusinski et al.
(Continued)

FOREIGN PATENT DOCUMENTS

CN    101990710 A    3/2011
EP       1359607 A2   11/2003
(Continued)

OTHER PUBLICATIONS

Banerjee. P et al., "ALD based Metal-insulator-metal (MIM) Nanocapacitors for Energy Storage", ECS Transactions, vol. 25, No. 4, pp. 345-353 (2009).
(Continued)

*Primary Examiner* — Michael P McFadden
(74) *Attorney, Agent, or Firm* — Morgan, Lewis & Bockius LLP

(57) ABSTRACT

A capacitor includes a structure including a plurality of openings penetrating from a first surface of the structure to a second surface opposing the first surface; a capacitor layer disposed on the second surface of the structure and in the plurality of openings and including a dielectric layer, and a first electrode and a second electrode, the dielectric layer interposed between the first electrode and the second electrode; a first connection layer disposed on the first surface of the structure and connected to the first electrode; a second connection layer disposed on the capacitor layer on the second surface and connected to the second electrode of the structure; and first and second terminals disposed on opposite side surfaces of the structure and connected to the first connection layer and the second connection layer, respectively.

18 Claims, 8 Drawing Sheets

(51) Int. Cl.
*H01G 4/248* (2006.01)
*H01G 4/012* (2006.01)
*H01G 4/30* (2006.01)
*H01G 4/12* (2006.01)
*H01L 49/02* (2006.01)
*H01G 4/08* (2006.01)

(52) U.S. Cl.
CPC ......... *H01G 4/1209* (2013.01); *H01G 4/1236* (2013.01); *H01G 4/1272* (2013.01); *H01G 4/2325* (2013.01); *H01G 4/248* (2013.01); *H01G 4/306* (2013.01); *H01L 28/87* (2013.01); *H01L 28/91* (2013.01)

(58) Field of Classification Search
USPC ........................................................ 361/303
See application file for complete search history.

(56) References Cited

U.S. PATENT DOCUMENTS

| | | |
|---|---|---|
| 2004/0238872 A1 | 12/2004 | Lee et al. |
| 2014/0217549 A1* | 8/2014 | Tzeng .................... H01L 24/83 |
| | | 257/532 |
| 2015/0296623 A1* | 10/2015 | Trinh .................... H01L 23/498 |
| | | 174/260 |
| 2016/0093686 A1* | 3/2016 | Yoon ....................... H01L 28/40 |
| | | 257/532 |
| 2016/0233026 A1* | 8/2016 | Masuda ................. H01G 4/248 |

FOREIGN PATENT DOCUMENTS

| | | |
|---|---|---|
| JP | 2004-274067 A | 9/2004 |
| JP | 2015-192083 A | 11/2015 |
| KR | 10-0644526 B1 | 11/2006 |
| KR | 10-0960476 B1 | 6/2010 |
| KR | 10-2016-0061959 A | 6/2016 |
| WO | 2016/154339 A1 | 10/2009 |
| WO | 2015/047233 A1 | 4/2015 |
| WO | 2009/126204 A2 | 9/2016 |

OTHER PUBLICATIONS

Korean Office Action dated Nov. 16, 2018 issued in Korean Patent Application No. 10-2017-0139478 (with English translation).
First Office Action dated Apr. 24, 2020 in Chinese Patent Application No. 201811092754.9 (English Translation).

* cited by examiner

CAPACITOR AND METHOD OF MANUFACTURING THE SAME

CROSS-REFERENCE TO RELATED APPLICATION(S)

This application claims benefit of priority to Korean Patent Application Nos. 10-2017-0126108 filed on Sep. 28, 2017 and 10-2017-0139478 filed on Oct. 25, 2017 in the Korean Intellectual Property Office, the disclosure of which is incorporated herein by reference in its entirety.

TECHNICAL FIELD

The present disclosure relates to a capacitor and a method of manufacturing the same.

BACKGROUND

As electronic devices such as smartphones, wearable devices, and the like are miniaturized, new technologies capable of significantly increasing capacitance of a capacitor, while retaining the same volume, have been developed.

Theoretically, in order to increase capacitance, there are generally three methods. The three methods include a method of using a material having high dielectric permittivity (high-k) as a dielectric, a method of increasing an area in which electrodes face each other, and a method of reducing a thickness of a dielectric layer between the electrodes. Existing representative microcapacitor products each have strategies to achieve high capacitance through a combination of the three methods described above.

In the case of a multilayer ceramic capacitor (MLCC), capacitance thereof may be increased by using a material having high dielectric permittivity of a perovskite structure as a dielectric, connecting a plurality of dielectric layers, repeatedly deposited in parallel to each other, disposing a distance between the electrodes to be close, and reducing a thickness of the dielectric layer.

In the case of a thin film silicon capacitor, capacitance thereof may be increased by etching a silicon substrate with a semiconductor process to form a three-dimensional structure, extending an area of electrodes, and significantly reducing a thickness of a dielectric layer with a thin film deposition process.

In the case of a tantalum capacitor, capacitance thereof may be increased by forming a porous structure to significantly increase a surface area and forming a thin film by an electrochemical reaction and an electrolytic polymerization method.

However, since a fundamental technical limitation has been reached, it is increasingly difficult to increase the capacitance of capacitors as described above.

Accordingly, although new technologies for increasing the capacitance of the capacitor have been developed, high technical constraints should be solved to commercialize such new technologies.

SUMMARY

An aspect of the present disclosure may provide a capacitor capable of significantly improving capacitance of the capacitor, and a method of manufacturing the same.

According to an aspect of the present disclosure, a capacitor may include a structure including a plurality of openings penetrating from a first surface of the structure to a second surface opposing the first surface; a capacitor layer disposed on the second surface and the plurality of openings and including a dielectric layer, and a first electrode and a second electrode, the dielectric layer interposed between the first electrode and the second electrode; a first connection layer disposed on the first surface and connected to the first electrode; a second connection layer disposed on the capacitor layer on the second surface and connected to the second electrode; and first and second terminals disposed on opposite side surfaces of the structure and connected to the first connection layer and the second connection layer, respectively.

According to another aspect of the present disclosure, a method of manufacturing a capacitor may include preparing a structure including a plurality of openings penetrating from a first surface of the structure to a second surface opposing the first surface; forming a first connection layer on the first surface; forming a capacitor layer disposed on the second surface and the plurality of openings and including a dielectric layer, and a first electrode and a second electrode, the dielectric layer interposed between the first electrode and the second electrode; forming a second connection layer connected to the second electrode on the second surface; and forming first and second terminals connected to the first connection layer and the second connection layer, respectively, on side surfaces of the structure.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
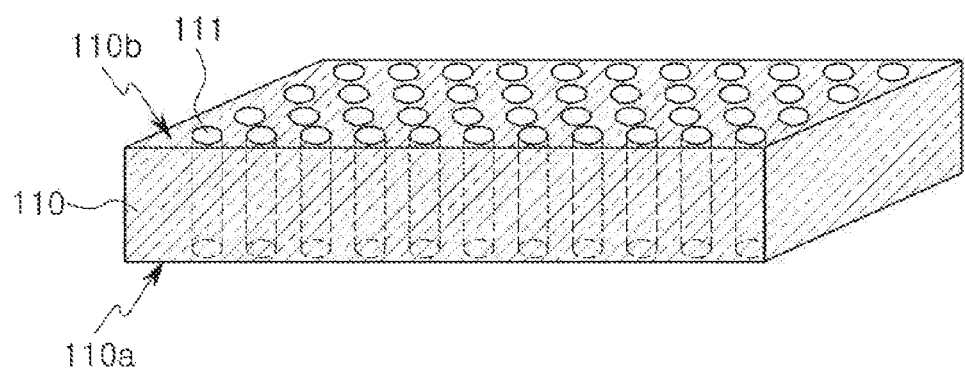
FIG. 1 is a perspective view illustrating a structure according to an exemplary embodiment of the present disclosure.

FIG. 1 is a perspective view illustrating a structure according to an exemplary embodiment of the present disclosure.

A capacitor according to an exemplary embodiment in the present disclosure may include a structure 110.

The structure 110 may include a plurality of openings 111 penetrating from a lower surface 110a of the structure 110 to an upper surface 110b opposing the lower surface 110a.

Since the opening may be referred to as a pore, the structure may be referred to as a porous structure. Such a porous structure may be obtained by machining an anodic aluminum oxide (AAO) structure in which pores having a nanometer size (10 nm to 400 nm) are regularly arranged on a surface by an anodic oxidation method. An interval between the pores may be about several tens to several hundred nanometers. A size, an interval and a depth of the pores may be variously adjusted by changing conditions of the anodic oxidation method such as an anodic oxidation voltage, the type and concentration of electrolyte, and a temperature. A capacitor manufactured in a dot form on a wafer through an atomic layer deposition (ALD) process using the AAO structure is disclosed in a reference document (Banerjee et al., ECS Transactions, 25 (4) 345-353, 2009).

Figure 2:
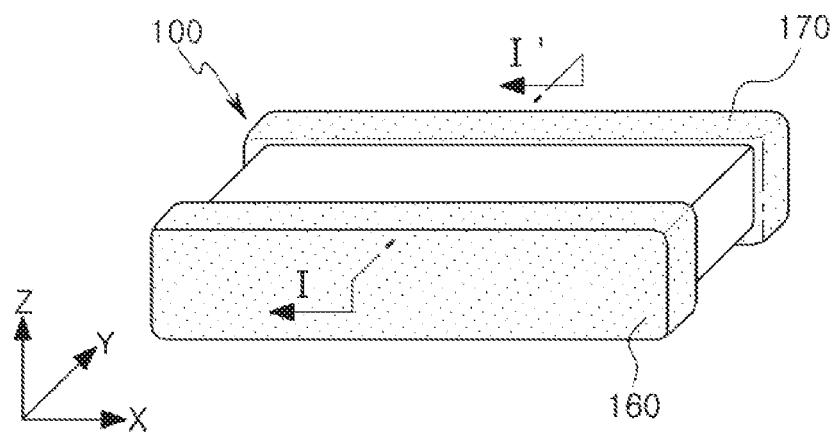
FIG. 2 is a perspective view illustrating a capacitor according to an exemplary embodiment of the present disclosure.
Figure 3:
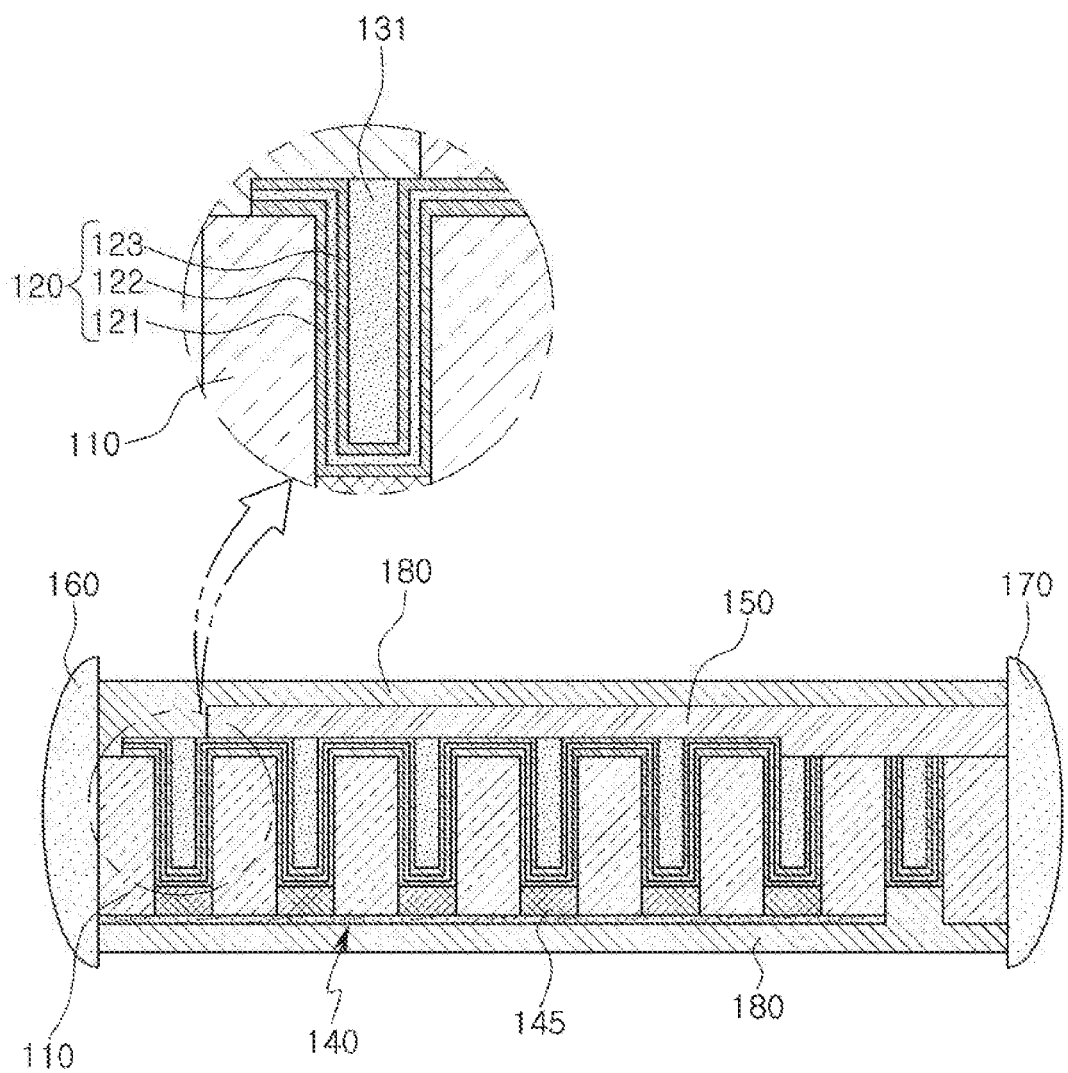
FIG. 3 is a cross-sectional view taken along a line I-I' of FIG. 2.

FIG. 2 is a perspective view illustrating a capacitor according to an exemplary embodiment of the present disclosure and FIG. 3 is a cross-sectional view illustrating a YZ surface of the capacitor taken along a line I-I' of FIG. 2.

Referring to FIGS. 2 and 3, a capacitor 100 according to an exemplary embodiment in the present disclosure may include a structure 110, a capacitor layer 120, a first connection layer 140, and a second connection layer 150. In addition, the capacitor 100 may further include a first terminal 160 and a second terminal 170.

A shape of the structure 110 is not particularly limited, but may be generally a hexahedral shape. In addition, a size of the structure 110 is not particularly limited, but may be, for example, the size of 0.4 mm×0.2 mm or 0.6 mm×0.3 mm. As described in FIG. 1, the structure 110 may include a plurality of openings penetrating from one surface of a substrate to the other surface thereof. In addition, the structure 110 may have a thickness of 100 μm or less.

The capacitor layer 120 may be disposed on the lower surface of the structure 110 and in the plurality of openings.

The capacitor layer 120 may include a first electrode 121, a dielectric layer 123, and a second electrode 122. Since the first electrode 121, the dielectric layer 123, and the second electrode 122 are stacked in order, the dielectric layer 123 may be disposed between the first electrode 121 and the second electrode 122.

The first electrode 121, the dielectric layer 123, and the second electrode 122 may be formed by using an atomic layer deposition (ALD) process or an atomic vapor deposition (AVD) process, but is not limited thereto.

The first electrode 121 and the second electrode 122 are disposed to face each other while having the dielectric layer 123 interposed therebetween, such that the first electrode 121 and the second electrode 122 may operate as a capacitor when voltages of different polarities are applied thereto. That is, the first electrode 121 and the second electrode 122 are disposed while having the first dielectric layer 123 interposed therebetween, such that the capacitor layer 120 may have a metal-insulator-metal (MIM) structure.

In the case in which the capacitor layer 120 is disposed in the opening of the structure 110, a space may be formed in an upper portion of the center of the opening. Such a space may cause a crack in the structure 110 or the capacitor layer 120. Therefore, a filling part 131 may be disposed on the capacitor layer 120 within the opening of the structure 110. That is, the filling part 131 may fill a remaining space after the capacitor layer 120 is disposed in the opening of the structure 110.

The filling part 131 may be a conductor such as tungsten (W) or polycrystalline silicon, but is not limited thereto. In the case in which the filling part 131 is the conductor, resistance between an electrode and a connection layer, adjacent to the filling part 131, may be significantly reduced. In the case in which the filling part 131 is tungsten (W), the filling part 131 may not require a high temperature heat treatment unlike polycrystalline silicon. For example, the first filling part 131 may be manufactured by a sputtering process using tungsten (W).

The first connection layer 140 may be disposed on a first surface (a lower surface in FIG. 3) of the structure 110. The first connection layer 140 is not disposed on the entirety of the first surface of the structure 110, but may be disposed on a region other than a first region of the first surface of the structure 110 (a right region of lower surface of 110 in FIG. 3). That is, the first connection layer 140 may be disposed on the first surface other than a partial region in contact with a second side surface on which the second terminal 170 is disposed. The first electrode 121 of the capacitor layer 120 may be exposed to a lower portion of the opening of the structure 110, and the first connection layer 140 may be connected to the first electrode 121.

Here, a metal layer 145 may be disposed between the first connection layer 140 and the first electrode 121. The metal layer 145 may be formed by forming the first connection layer 140 and then performing an electroplating process in which the first connection layer 140 is used as a seed layer. When the first electrode 121 is deposited on an inner side of the opening, the first electrode 121 may also be deposited on the metal layer 145.

The second connection layer 150 may be disposed on a second surface (an upper surface in FIG. 3) of the structure 110. Specifically, the second connection layer 150 may be disposed on the second surface of the structure 110 to cover the capacitor layer 120 and may be connected to the second electrode 122 disposed on the uppermost surface of the capacitor layer 120. The second connection layer 150 is not disposed on the entirety of the second surface of the structure 110, but may be disposed on a region other than a second region of the second surface of the structure 110 (a left region of the upper surface of the structure 110 in FIG. 3) as illustrated in FIG. 3. That is, the second connection layer 150 may be disposed on the second surface other than a partial region in contact with a first side surface on which the first terminal 160 is disposed.

Figure 4:
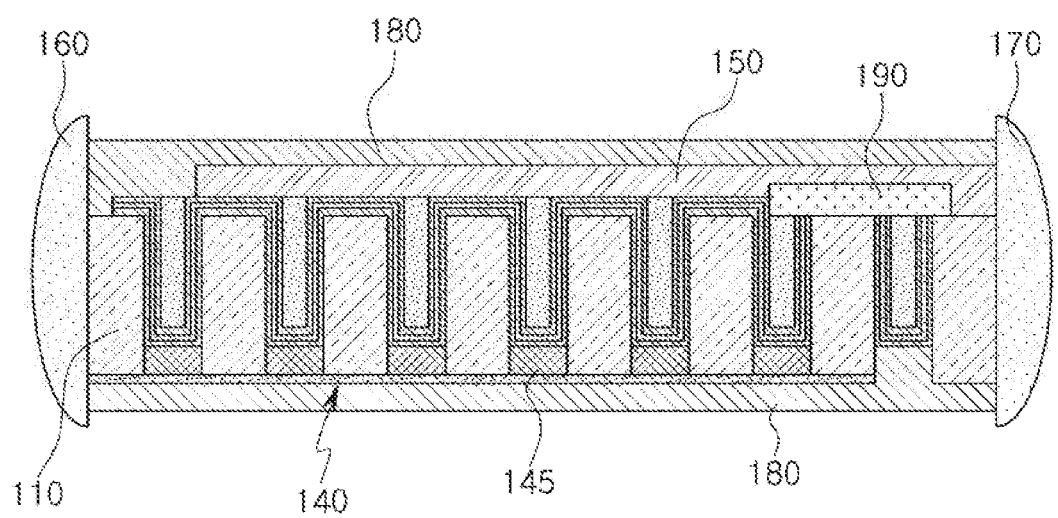
FIG. 4 is a cross-sectional view illustrating a capacitor that further includes an insulating layer in the cross-sectional view of FIG. 3.

Meanwhile, an insulating layer may be disposed on a first region of the second surface of the structure 110 opposing the second region of the second surface of the structure 110. Referring to FIG. 4, a cross-section view of the capacitor that further includes an insulating layer 190 in the cross-sectional view of FIG. 3 may be seen. The insulating layer 190 may be disposed on the first region of the second surface of the structure 110 so that the second connection layer 150 in contact with the second electrode 122 is not connected to the first electrode 121 and the dielectric layer 123, thereby insulating between the second connection layer 150, and the first electrode 121 and the dielectric layer 123.

Hereinafter, the structure 110 in which the capacitor layer 120, the first connection layer 140, and the second connection layer 150 are disposed is referred to as a body.

Additionally, the capacitor according t an exemplary embodiment in the present disclosure may include a protective layer 180. The protective layer 180 may be disposed to surround the body other than the side surfaces on which the first terminal 160 and the second terminal 170 are disposed. The protective layer 180 may be formed of a polymer material, for example, a polymer resin such as epoxy, but is not limited thereto. The protective layer 180 may protect the capacitor from external impact or conductive foreign materials.

The first terminal 160 and the second terminal 170 may be disposed on opposite side surfaces of the body.

Since the first terminal 160 is connected to the first connection layer 140 exposed to the first side surface of the body, the first terminal 160 may be electrically connected to the first electrode 121. In addition, since the second terminal 170 is connected to the second connection layer 150 exposed to the second side surface of the body, the second terminal 170 may be electrically connected to the second electrode 122. The first terminal 160 and the second terminal 170 may be implemented to have a low resistance value using copper, a copper alloy, or the like, and may be formed by a paste printing process.

In the capacitor according to an exemplary embodiment in the present disclosure, the porous structure which may be formed by anodic aluminum oxide (AAO) is used, the capacitor layer of the MIM structure is deposited, and the electrodes of the capacitor layer are then connected to the terminals on the opposite side surface of the porous structure. Since the capacitor layer is formed in the plurality of openings, an area of the MIM structure may be increased. As a result, capacitance of the capacitor may be improved. In addition, since the terminals are disposed in directions of the side surfaces of the capacitor, the capacitor may be implemented to have low equivalent series inductance (ESL).

In addition, since the capacitor according to an exemplary embodiment in the present disclosure may be formed in a structure having a thickness of 100 μm or less, the capacitor may be thinned. In addition, assuming that a diameter of the opening is 200 nm, there are openings of $8.2 \times 10^8$ to $1.6 \times 10^9$ per 1 $cm^2$, and since the openings may be connected in parallel to each other, the capacitor may be implemented to have the low ESR.

As described above, since the capacitor according to an exemplary embodiment in the present disclosure has a high capacitance single layer structure, the capacitor may be used as a land-side capacitor (LSC) in a chip package requiring a thin thickness.

Figure 5:
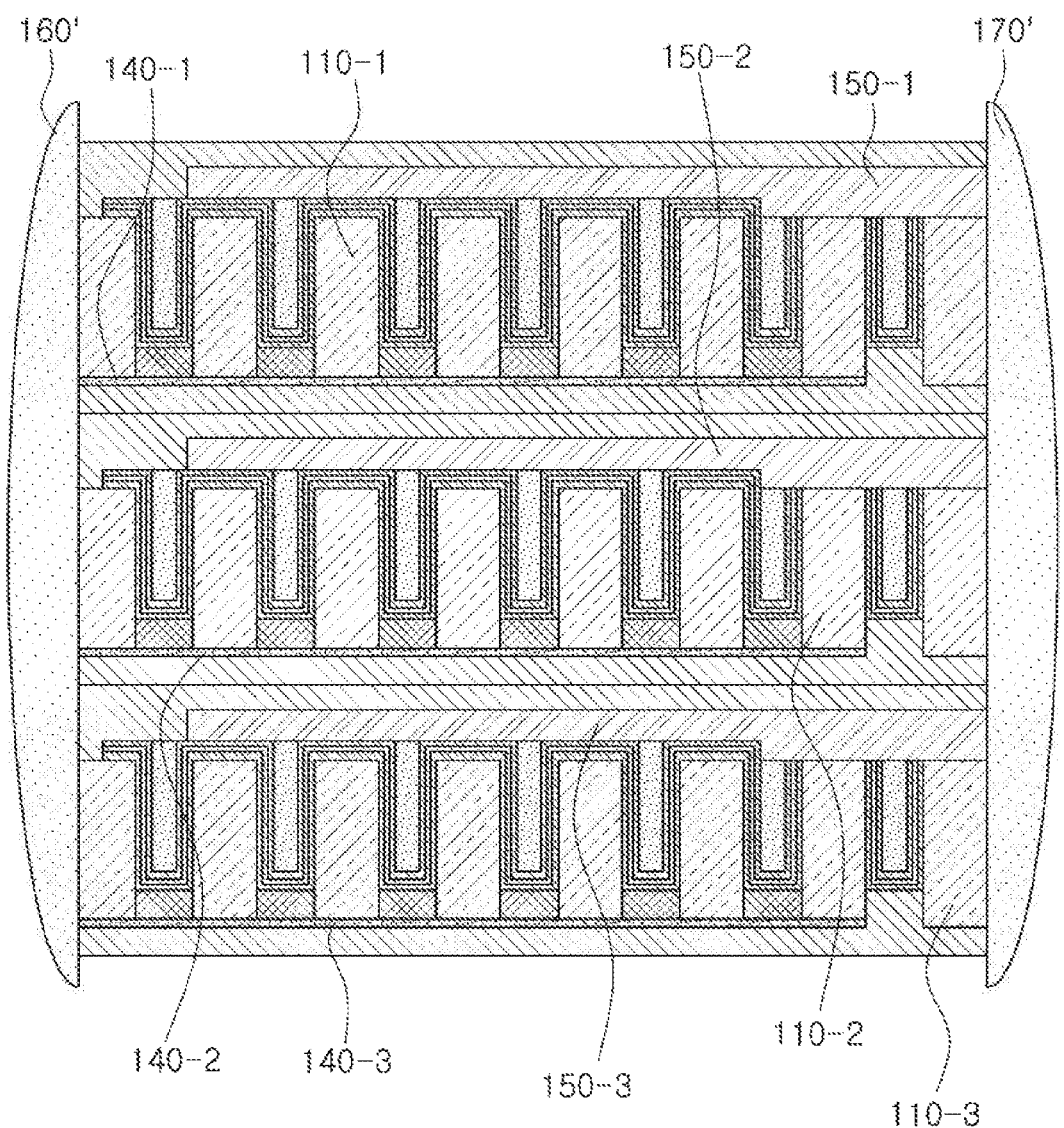
FIG. 5 is a cross-sectional view illustrating a capacitor including a body stacked according to another exemplary embodiment in the present disclosure.

FIG. 5 is a cross-sectional view illustrating a capacitor including a body stacked according to another exemplary embodiment in the present disclosure.

Bodies including structures, first connection layers, and second connection layers are stacked to form one capacitor.

For example, a first body including a first structure 110-1, a second boy including a second structure 110-2, and a third body including a third structure 110-3 may be stacked. In addition, the first connection layers 140-1, 140-2, and 140-3 of the first to third bodies may be connected to a first terminal 160', and the second connection layers 150-1, 150-2, and 150-3 of the first to third bodies may be connected to a second terminal 170'.

By such a stacked structure, the capacitor according to another exemplary embodiment in the present disclosure may have more improved capacitance.

Figure 6:
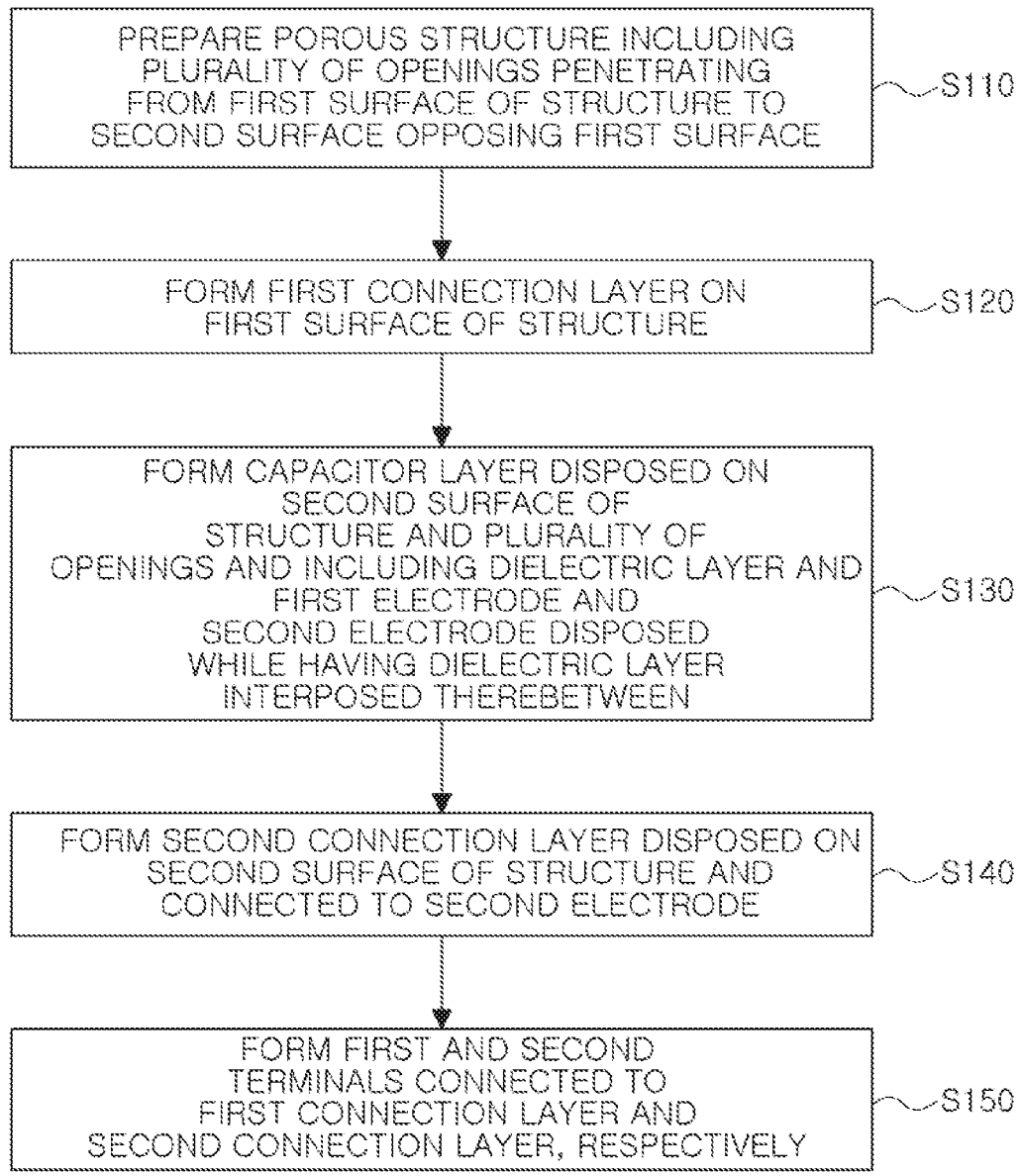
FIG. 6 is a flowchart schematically illustrating a method of manufacturing a capacitor according to an exemplary embodiment in the present disclosure.

FIG. 6 is a flowchart schematically illustrating a method of manufacturing a capacitor according to an exemplary embodiment in the present disclosure and FIGS. 7 through 14 are views schematically illustrating the respective steps of the method of manufacturing a capacitor according to an exemplary embodiment in the present disclosure.

A method of manufacturing a capacitor according to an exemplary embodiment in the present disclosure may include an operation (S110) of preparing a structure including a plurality of openings penetrating from a first surface of the structure to a second surface opposing the first surface, an operation (S120) of forming a first connection layer on the first surface of the structure, an operation (S130) of forming a capacitor layer disposed on the second surface of the structure and the plurality of openings and including a dielectric layer, and a first electrode and a second electrode disposed while having the dielectric layer interposed therebetween, an operation (S140) of forming a second connection layer disposed on the second surface of the substrate and connected to the second electrode, and an operation (S150) of forming first and second terminals connected to the first connection layer and the second connection layer, respectively.

Hereinafter, the respective operations will be described with reference to FIGS. 7 through 14.

Figure 7:
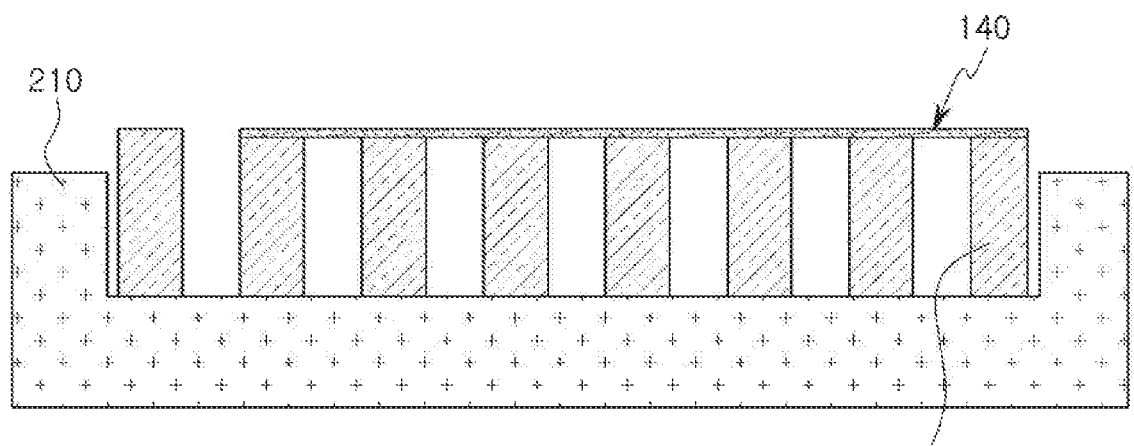
FIGS. 7 through 14 are views schematically illustrating the respective steps of the method of manufacturing a capacitor according to an exemplary embodiment in the present disclosure.

Referring to FIG. 7, a structure 110 including a plurality of openings may be prepared on a jig 210. It was described with reference to FIG. 1 that the structure 110 may be an anodic aluminum oxide (AAO) structure. In addition, a first connection 140 may be formed on a first surface of the structure 110 (an upper surface of the structure in FIG. 7). As illustrated in FIG. 7, the first connection layer 140 may not be formed on one region of the first surface of the structure 110. The first connection layer 140 may be formed by a metal paste screen printing process, or may be formed by a photo-etching process after a metal sputtering process.

Figure 8:
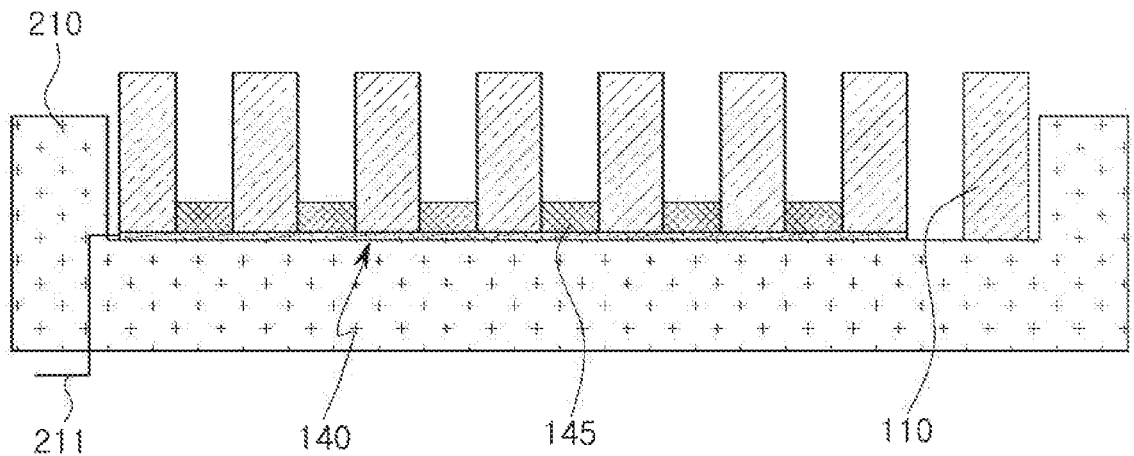

Next, as illustrated in FIG. 8, the structure 110 on which the first connection layer 140 is disposed may be turned over and then disposed on the jig 210. Thereafter, a wire 211 may be connected to the first connection layer 140, and an electroplating process may be performed by using the first connection layer 140 as a seed layer. By such an electroplating process, a metal layer 145 contacted to the first connection layer 140 may be formed. The metal layer 145 formed in a lower portion of the opening of the structure 110 may have a thickness in the range of 0.5 to 2 μm.

Figure 9:
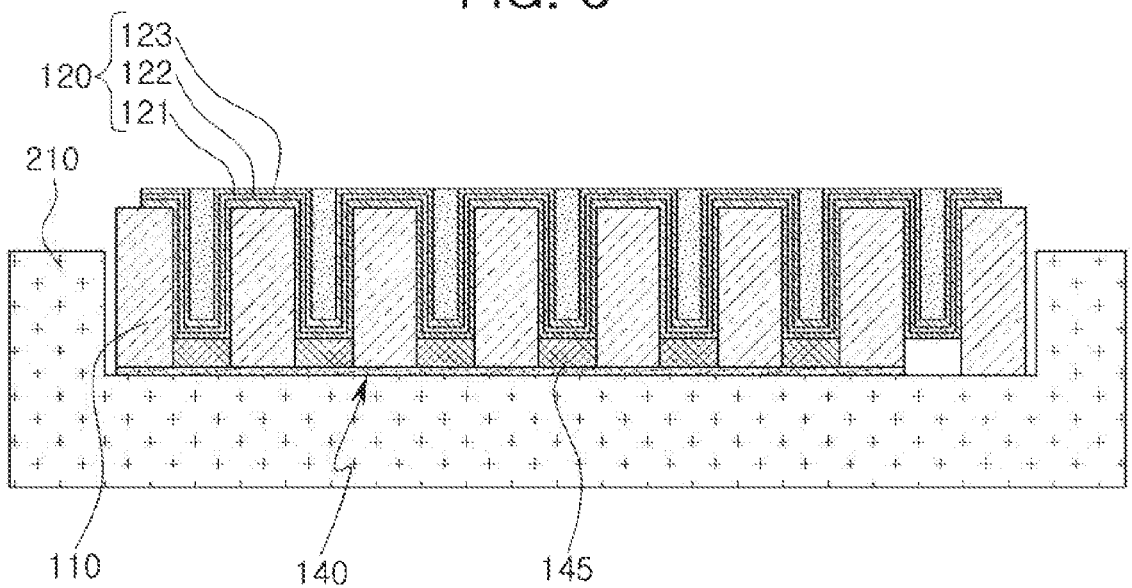

Next, as illustrated in FIG. 9, a first electrode 121, a dielectric layer 123, and a second electrode 122 may be deposited on a second surface of the structure 110 (an upper surface of the structure in FIG. 8 and FIG. 9) and in the plurality of the openings in order through an atomic layer deposition (ALD) process or an atomic vapor deposition (AVD) process. The first electrode 121 and the second electrode 122 may be formed of TiN, and the dielectric layer 123 may be formed of any one or combination of metal oxides such as $Al_2O_3$, $ZrO_2$, and $HfO_2$, or ZAZ which is a $ZrO_2$—$Al_2O_3$—$ZrO_2$ composite layer. A filling part 131 may be disposed on the capacitor layer 120 within the opening of the structure 110. That is, the filling part 131 may fill a remaining space after the capacitor layer 120 is disposed in the opening of the structure 110. The filling part 131 may be a conductor such as tungsten (W) or polycrystalline silicon, but is not limited thereto. In the case in which the filling part 131 is tungsten (W), the first filling part 131 may be manufactured by a sputtering process using tungsten (W).

Figure 10:
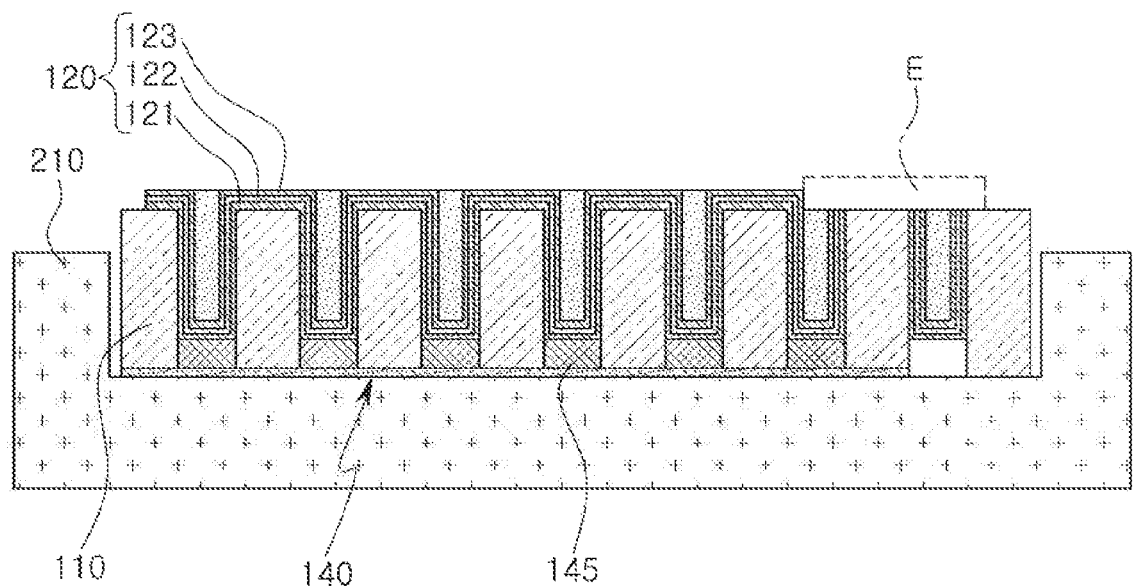

Next, as illustrated in FIG. 10, the capacitor layer 120 formed on a region E of the second surface of the structure 110 may be removed by an etching process such as photo-dry etching (PDE).

Figure 11:
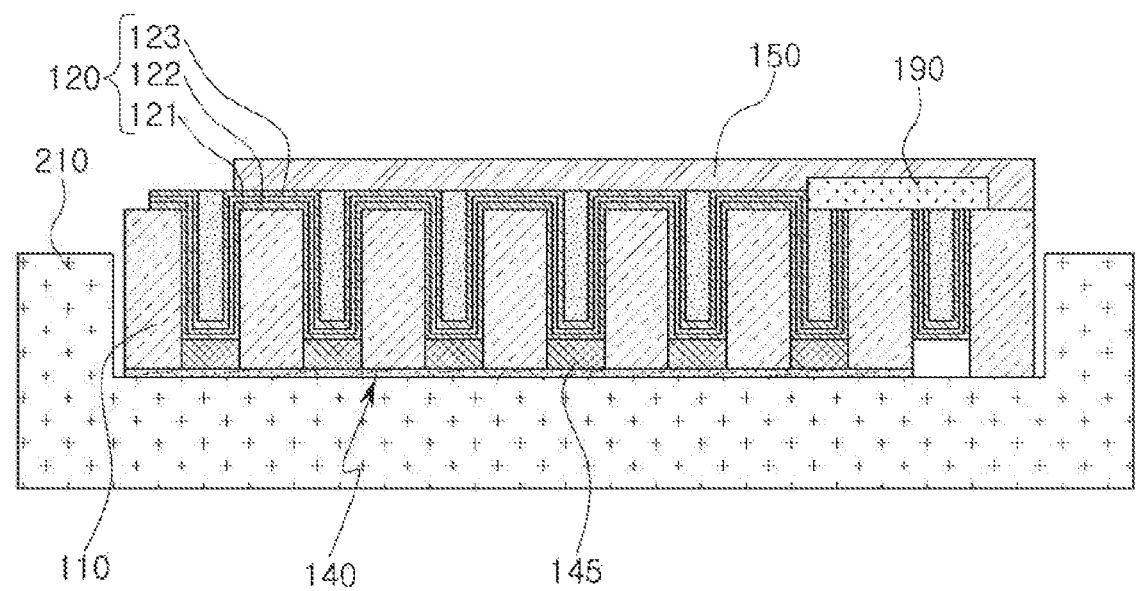

Next, referring to FIG. 11, a second connection layer 150 may be formed on the second surface of the structure 110. Before forming the second connection layer 150, an insulating layer 190 may be formed on the region E of the second surface of the structure 110. In a case in which the second connection layer 150 is formed after the insulating layer 190 is formed, insulation between the second connection layer 150, and the first electrode 121 and the second electrode 123 may be ensured. The second connection layer 150 may formed by applying a metal paste through a screen printing process.

Figure 12:
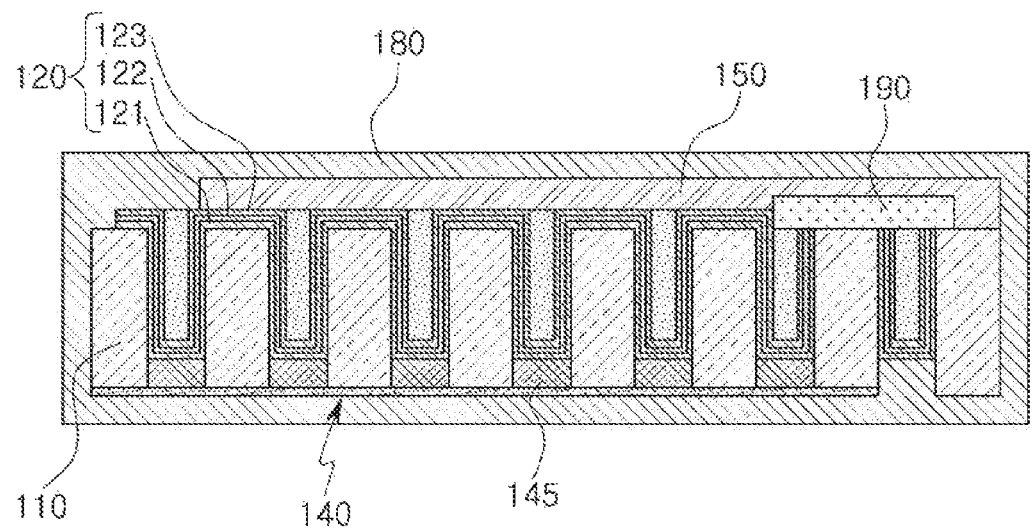

Next, as illustrated in FIG. 12, a protective layer 180 may be formed on an outer surface of a body by dipping the body in polymer.

Figure 13:
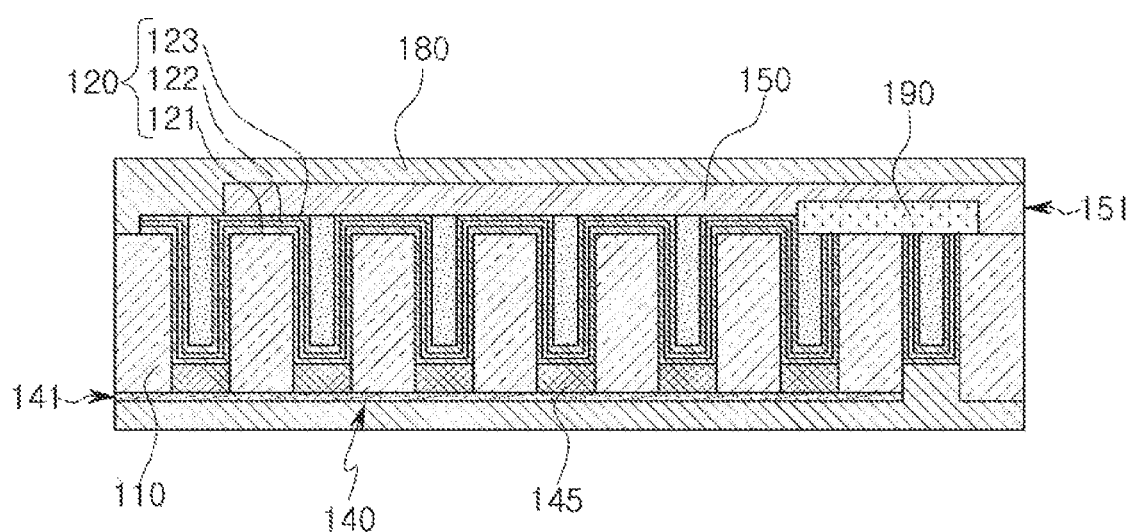

Next, as illustrated in FIG. 13, a dicing process of cutting a cross section of the body may be performed. Meanwhile, the operations described with reference to FIGS. 7 through 12 may be performed in a form of a substrate having a width of several tens millimeters (mm) for convenience of processing and efficiency of production, and the substrate may be divided into a size of the capacitor through the dicing process. The dicing process may be performed as a mechanical dicing process, or may be performed as a non-contact dicing process such as a laser dicing process. By such a dicing process, one side 141 of the first connection layer 140 may be exposed to the first side surface of the body and one side 151 of the second connection layer 150 may be exposed to the second side surface of the body.

Figure 14:
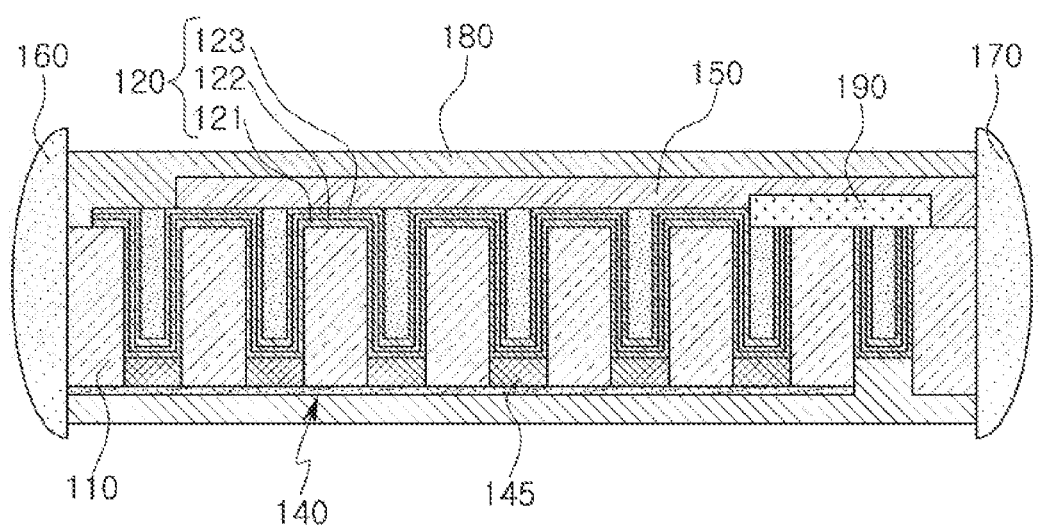

Next, as illustrated in FIG. 14, a first terminal 160 and a second terminal 170 may be formed on opposite side surfaces of the body. The first terminal 160 may be connected to the first connection layer 140 exposed to the first side surface of the body and the second terminal 170 may be connected to the second connection layer 150 exposed to the second side surface of the body. The first and second terminals may be formed by a printing process using a paste including a conductive material, or may be formed by dipping the opposite side surfaces of the body in the paste.

As set forth above, according to the exemplary embodiments in the present disclosure, since the capacitor has the MIM structure formed in the structure including a plurality of openings penetrating through an inner side of the capacitor, a total surface area capable of implementing the capacitance of the capacitor may be significantly increased and the capacitance of the capacitor may be thus significantly increased.

While exemplary embodiments have been shown and described above, it will be apparent to those skilled in the art that modifications and variations could be made without departing from the scope of the present invention as defined by the appended claims.

What is claimed is:

1. A capacitor comprising:
a structure including a plurality of openings penetrating from a first surface of the structure to a second surface opposing the first surface;
a capacitor layer disposed on the second surface of the structure and in the plurality of openings and including a dielectric layer, and a first electrode and a second electrode, the dielectric layer interposed between the first electrode and the second electrode;
a filling part comprising a conductor and disposed in a remaining space of the plurality of openings;
a first connection layer disposed on the first surface of the structure and connected to the first electrode;
a second connection layer disposed on the capacitor layer and connected to the second electrode on the second surface of the structure;
first and second terminals disposed on opposite side surfaces of the structure and connected to the first connection layer and the second connection layer, respectively; and
a metal layer disposed between the first connection layer and the first electrode, and disposed in each of the plurality of openings.

2. The capacitor of claim 1, wherein the structure is an anodic aluminum oxide (AAO) structure having the plurality of openings.

3. The capacitor of claim 1, wherein the dielectric layer includes any one or combination of $Al_2O_3$, $ZrO_2$, and $HfO_2$, or a $ZrO_2$— $Al_2O_3$— $ZrO_2$ composite layer (ZAZ).

4. The capacitor of claim 1, wherein the first connection layer is disposed on the first surface of the structure other than a partial region in contact with a second side surface on which the second terminal is disposed, and
the second connection layer is disposed on the second surface of the structure other than a partial region in contact with a first side surface on which the first terminal is disposed.

5. The capacitor of claim 1, further comprising an insulating layer disposed on a partial region of the second surface of the structure in contact with one of the side surfaces on which the second terminal is disposed to insulate between the second connection layer and the capacitor layer.

6. The capacitor of claim 1, wherein the filling part is one of tungsten (W) or polycrystalline silicon.

7. The capacitor of claim 1, further comprising a plurality of bodies stacked on each other,
wherein each of the plurality of the bodies includes the structure, the capacitor layer, and the first and second connection layers.

8. The capacitor of claim 1, wherein the first electrode and the second electrode each include TiN.

9. The capacitor of claim 1, wherein a distribution of the plurality of openings is in a range of $8.2 \times 10^8$ to $1.6 \times 10^9$ per 1 $cm^2$.

10. The capacitor of claim 1, wherein each of the plurality of openings has a size of 10 nm to 400 nm.

11. The capacitor of claim 1, wherein the filling part includes one of tungsten (W) or polycrystalline silicon.

12. The capacitor of claim 1, wherein the filling part is tungsten (W).

13. A method of manufacturing a capacitor, the method comprising:
preparing a structure including a plurality of openings penetrating from a first surface of the structure to a second surface of the structure opposing the first surface of the structure;
forming a first connection layer on the first surface of the structure;
after the forming of the first connection layer, forming a metal layer by an electroplating process using the first connection layer as a seed layer;
forming a capacitor layer disposed on the second surface of the structure and in the plurality of openings and including a dielectric layer, and a first electrode and a second electrode, the dielectric layer interposed between the first electrode and the second electrode;
forming a filling part comprising a conductor in a remaining space of the plurality of openings;
forming a second connection layer connected to the second electrode on the second surface of the structure; and
forming first and second terminals connected to the first connection layer and the second connection layer, respectively, on side surfaces of the structure,
wherein the metal layer is disposed between the first connection layer and the first electrode, and is disposed in each of the plurality of openings.

14. The method of claim 13, further comprising performing anodic oxidation to form the plurality of openings in the structure which is an anodic aluminum oxide (AAO) structure.

15. The method of claim 13, wherein the first electrode, the dielectric layer, and the second electrode are deposited in order through an atomic layer deposition (ALD) or atomic vapor deposition (AVD) process.

16. The method of claim 13, wherein the first connection layer is formed on the first surface of the structure so as not to be in contact with a second side surface of the structure on which the second terminal is disposed, and the second connection layer is formed on the second surface of the structure so as not to be in contact with a first side surface of the structure on which the first terminal is disposed.

17. The method of claim 13, further comprising forming an insulating layer on a partial region of the second surface of the structure in contact with one of the side surfaces on which the second terminal is disposed.

18. The method of claim 13, further comprising, stacking a plurality of bodies before the forming of the first and second terminals, each of the plurality of the bodies including the structure, the capacitor layer, and the first and second connection layers.

* * * * *